United States Patent
Chen et al.

(10) Patent No.: US 9,412,946 B2
(45) Date of Patent: Aug. 9, 2016

(54) METHOD FOR MANUFACTURING AN ORGANIC LIGHT EMITTING DISPLAY PANEL AND RELATED ORGANIC LIGHT EMITTING DISPLAY PANEL

(71) Applicant: AU Optronics Corp., Hsin-Chu (TW)

(72) Inventors: Peng-Yu Chen, Hsin-Chu (TW); Chia-Hwa Lee, Hsin-Chu (TW)

(73) Assignee: AU Optronics Corp., Hsin-Chu (TW)

( * ) Notice: Subject to any disclaimer, the term of this patent is extended or adjusted under 35 U.S.C. 154(b) by 0 days.

(21) Appl. No.: 14/201,940

(22) Filed: Mar. 10, 2014

(65) Prior Publication Data
US 2014/0346472 A1 Nov. 27, 2014

(30) Foreign Application Priority Data
May 22, 2013 (TW) .............................. 102118117 A

(51) Int. Cl.
*H01L 27/32* (2006.01)
*H01L 51/00* (2006.01)

(52) U.S. Cl.
CPC ........ *H01L 51/0005* (2013.01); *H01L 27/3246* (2013.01)

(58) Field of Classification Search
CPC .. H01L 51/56; H01L 27/3246; H01L 51/5012
USPC ................................. 313/498–512
See application file for complete search history.

(56) References Cited

U.S. PATENT DOCUMENTS

| | | | |
|---|---|---|---|
| 6,787,987 B2 * | 9/2004 | Duineveld | .......... H01L 27/3211 313/500 |
| 7,182,815 B2 | 2/2007 | Katagami | |
| 7,625,063 B2 | 12/2009 | White | |
| 7,932,109 B2 | 4/2011 | Hayata | |
| 2002/0109457 A1 | 8/2002 | Duineveld | |
| 2006/0146379 A1 * | 7/2006 | Katagami | ................ B41J 2/155 358/505 |
| 2008/0027030 A1 | 1/2008 | Stogniew | |
| 2008/0308037 A1 | 12/2008 | Bulovic | |

FOREIGN PATENT DOCUMENTS

| | | |
|---|---|---|
| CN | 1365891 A | 8/2002 |
| CN | 1425267 A | 6/2003 |
| TW | I294055 | 3/2008 |
| TW | 201200246 | 1/2012 |
| WO | 2011101630 A1 | 8/2011 |

* cited by examiner

*Primary Examiner* — Cuong Q Nguyen
*Assistant Examiner* — Nishath Yasmeen
(74) *Attorney, Agent, or Firm* — Winston Hsu; Scott Margo

(57) ABSTRACT

A method for manufacturing an organic light emitting display panel is disclosed. The organic light emitting display panel includes a substrate. The method includes forming a plurality of bank arrays, each of which has a plurality of banks, utilizing a plurality of ink-jet heads, each of which has a plurality of nozzles arranged alternately, to move relative to the substrate along a moving direction perpendicular to a border of the substrate, and utilizing at least one of the plurality of nozzles to drop organic light emitting ink for forming at least one organic light emitting pixel in at least one bank. An oblique angle is formed between an arrangement direction of the plurality of banks and the border of the substrate. Each ink-jet head forms the oblique angle cooperatively with the border of the substrate.

3 Claims, 2 Drawing Sheets

METHOD FOR MANUFACTURING AN ORGANIC LIGHT EMITTING DISPLAY PANEL AND RELATED ORGANIC LIGHT EMITTING DISPLAY PANEL

BACKGROUND OF THE INVENTION

1. Field of the Invention

The present invention relates to a method for manufacturing an organic light emitting display panel and a related organic light emitting display panel, and more specifically, to a method for utilizing ink-jet heads to manufacture an organic light emitting display panel and a related organic light emitting display panel.

2. Description of the Prior Art

With development of the ink-jet technology and the display technology, the method of dropping organic light emitting ink into pixel banks by an ink-jet printing process for forming organic light emitting pixels on a substrate has been widely applied to a display panel manufacturing process. In general, since a distance between two adjacent nozzles on an ink-jet head is not equal to a distance between two adjacent pixels, the ink-jet head could only utilize some of the nozzles, which are aligned with the pixels, to drop organic light emitting ink during the aforesaid pixel forming process, so as to cause a poor nozzle utilization efficiency of the ink-jet head. Therefore, in practical application, the display panel manufacturing process usually adopts the design of rotating the ink-jet head to form an oblique angle with the substrate, so that each nozzle could be aligned with the corresponding pixels. In such a manner, the nozzle utilization efficiency of the ink-jet head could be increased.

However, since number of the nozzles utilized by the ink-jet head could be different every time when the ink-jet head drops organic light emitting ink, the aforesaid design may make the ink volume jetted by each nozzle different from each other so as to cause a poor pixel forming quality. Accordingly, the image display quality of an organic light emitting display panel could be influenced.

SUMMARY OF THE INVENTION

The present invention provides a method for manufacturing an organic light emitting display panel. The organic light emitting display panel includes a substrate. The method includes forming a plurality of bank arrays, each of which has a plurality of banks, utilizing a plurality of ink-jet heads, each of which has a plurality of nozzles arranged alternately, to move relative to the substrate along a moving direction perpendicular to a border of the substrate, and utilizing at least one of the plurality of nozzles to drop organic light emitting ink for forming at least one organic light emitting pixel in at least one bank. An oblique angle is formed between an arrangement direction of the plurality of banks and the border of the substrate. Each ink-jet head forms the oblique angle cooperatively with the border of the substrate.

The present invention further provides an organic light emitting display panel. The organic light emitting display panel includes a substrate, a plurality of bank arrays, and a plurality of organic light emitting pixels. The substrate has a border. The plurality of bank arrays is formed on the substrate. Each bank array has a plurality of banks for containing organic light emitting ink. An oblique angle is formed between an arrangement direction of the plurality of banks and the border of the substrate. The plurality of organic light emitting pixels is formed on at least one bank of the plurality of banks.

The present invention further provides an organic light emitting display panel. The organic light emitting display panel includes a substrate, a plurality of bank arrays, and a plurality of organic light emitting pixels. The substrate has a border. The plurality of bank arrays is formed on the substrate. Each bank array has a plurality of banks for containing organic light emitting ink. An oblique angle is formed between a longitudinal direction of each bank and the border of the substrate. A plurality of organic light emitting pixels is formed on at least one bank of the plurality of banks.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
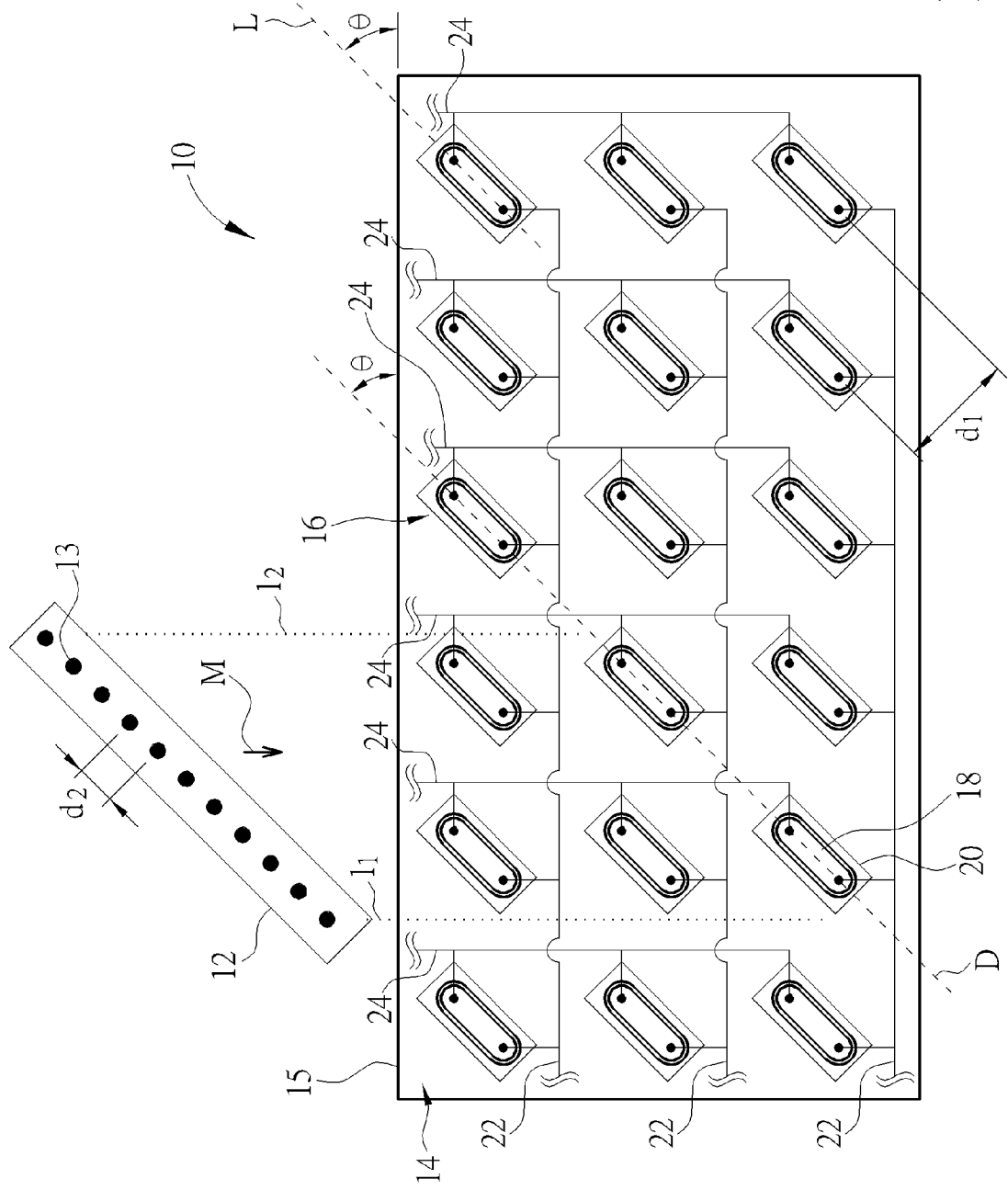
FIG. 1 is a diagram of an organic light emitting display panel according to an embodiment of the present invention.

Please refer to FIG. 1, which is a diagram of an organic light emitting display panel 10 according to an embodiment of the present invention. In this embodiment, the organic light emitting display panel 10 could be manufactured by utilizing a plurality of ink-jet heads 12 (only one shown in FIG. 1 for simplicity) to drop organic light emitting ink, but not limited thereto. As shown in FIG. 1, each ink-jet head 12 has nozzles 13 arranged alternately for dropping organic light emitting ink. The organic light emitting display panel 10 includes a substrate 14, a plurality of bank arrays 16, and a plurality of organic light emitting pixels 18. The substrate 14 is a conventional substrate applied to an organic light emitting display panel, such as a glass substrate or a transparent plastic substrate, and has a border 15. The ink-jet head 12 forms an oblique angle $\theta$ cooperatively with the border 15 of the substrate 14. The oblique angle $\theta$ could be greater than 0° and less than 90°.

The plurality of bank arrays 16 is formed on the substrate 14. Each bank array 16 could have a plurality of banks 20 for containing organic light emitting ink. As shown in FIG. 1, the oblique angle $\theta$ is also formed between an arrangement direction D of the plurality of banks 20 of each bank array 16 and the border 15 of the substrate 14, so as to achieve the purpose that the organic light emitting pixels 18 are arranged obliquely relative to the border 15 of the substrate 14. The plurality of organic light emitting pixels 18 is formed on the substrate 14 by utilizing each ink-jet head 12 to move relative to the substrate 14 along a moving direction M perpendicular to the border 15 and then utilizing the nozzles 13 on each ink-jet head 12 to drop organic light emitting ink into the corresponding banks 18, so as to form an image display region of the organic light emitting display panel 10. In this embodiment, the plurality of organic light emitting pixels 18 could be an OLED (Organic Light Emitting Diode) in a strip shape or a circular shape, and could be in a mosaic arrangement or a stripe arrangement (but not limited thereto). For example, if the plurality of organic light emitting pixels 18 is in a mosaic arrangement, the organic light emitting pixels 18 located in the same bank array 16 could be strip-shaped and formed on the substrate 14 in an RGB arrangement, and the color of each organic light emitting pixel 18 is different from that of the adjacent organic light emitting pixel 18. To be noted, as shown in FIG. 1, if each bank 20 is a shape having a longitudinal direction L for containing the corresponding organic light emitting pixel 18 with the similar shape (e.g. the strip shape as shown in FIG. 1), the longitudinal direction L of each bank 20 could also form the oblique angle θ cooperatively with the border 15 of the substrate 14, meaning that the arrangement direction D of the plurality of banks 20 is parallel to the longitudinal direction L of each bank 20.

Furthermore, as shown in FIG. 1, the organic light emitting display panel 10 could further include a plurality of data lines 22 and a plurality of scan lines 24. Each data line 22 and each scan line 24 are respectively coupled to the corresponding organic light emitting pixel 18 for controlling light emission of each organic light emitting pixel 18, so as to make the organic light emitting display panel 10 capable of displaying images. Since the related description for the circuit control design of each data line 22 and each scan line 24 is commonly seen in the prior art, it is therefore omitted herein.

Figure 2:
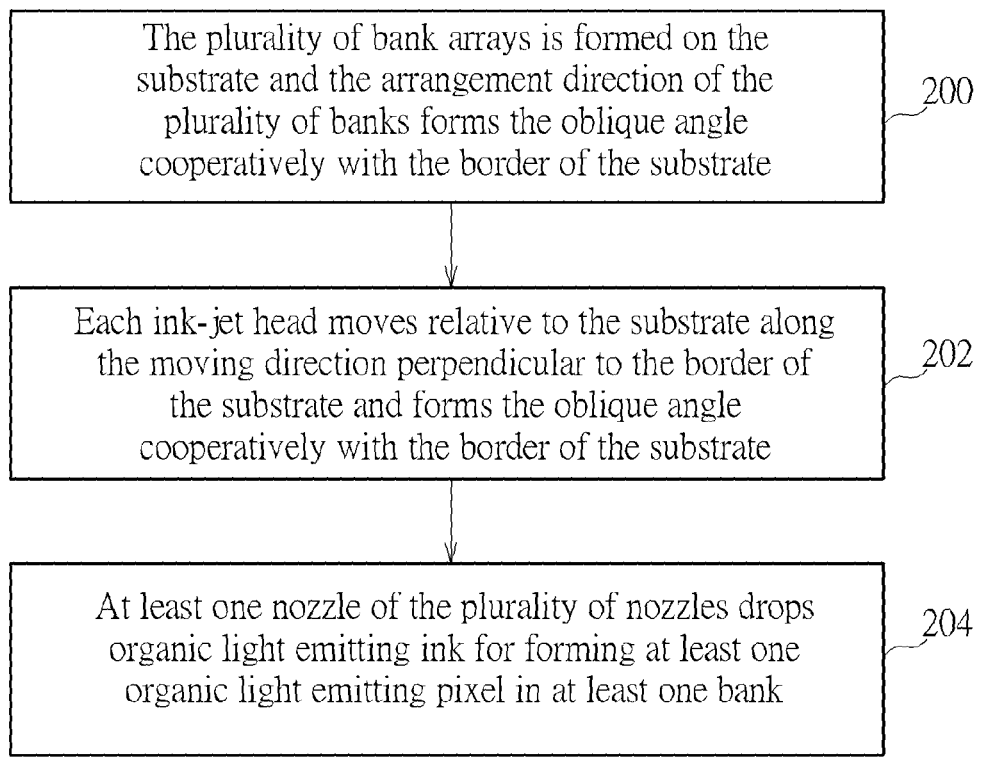
FIG. 2 is a flowchart of a method for manufacturing the organic light emitting display panel according to an embodiment of the present invention.

More detailed description for the forming process of the organic light emitting pixels 18 on the organic light emitting display panel 10 is provided as follows. Please refer to FIG. 1 and FIG. 2. FIG. 2 is a flowchart of a method for manufacturing the organic light emitting display panel 10 according to an embodiment of the present invention. The method includes the following steps.

Step 200: Form the plurality of bank arrays 16 on the substrate 14;

Step 202: Utilize each ink-jet head 12 to move relative to the substrate 14 along the moving direction M perpendicular to the border 15 of the substrate 14;

Step 204: Utilize at least one nozzle 13 of the plurality of nozzles 13 to drop organic light emitting ink for forming at least one organic light emitting pixel 18 in at least one bank 20.

In the following, the steps of utilizing the ink-jet head 12 as shown in FIG. 1 to form the corresponding organic light emitting pixels 18 on the substrate 14 is described in detail. As for description for the steps of utilizing other ink-jet heads 12 to form the corresponding organic light emitting pixels 18, it could be reasoned by analogy and therefore omitted herein. In Step 200, the plurality of bank arrays 16 for containing organic light emitting ink is formed on the substrate 14. As shown in FIG. 1, each bank array 16 has the plurality of banks 20 and the arrangement direction D of the plurality of banks 20 forms the oblique angle θ with the border 15 of the substrate 14. Each bank 20 could define a forming region for one organic light emitting pixel 18 on the substrate 14 by a conventional bank manufacturing process (e.g. a lithography process), so as to prevent the color mixing problem caused by mixing of the organic light emitting pixels 18 with different colors.

After the plurality of bank arrays 16 is formed, the ink-jet head 12 could be utilized to move relative to the substrate 14 along the moving direction M perpendicular to the border 15 of the substrate 14 (Step 202). At this time, the ink-jet head 12 and the arrangement direction D of each bank array 16 respectively form the oblique angle θ with the border 15. To be more specific, in practical application, the oblique angle θ could conform to the following equation.

the oblique angle θ=cos$^{-1}$[(a distance $d_1$ between two adjacent bank arrays 16)/(a distance $d_2$ between two adjacent nozzles 13 on each ink-jet head 12)].

In such a manner, via the aforesaid design in which the ink-jet head 12 and each bank array 16 have the same oblique angle θ relative to the border 15 of the substrate 14 and the ink-jet head 12 is utilized to move relative to the substrate 14 along the moving direction M perpendicular to the border 15 of the substrate 14, the purpose that number of the nozzles 13 utilized by the ink-jet head 12 is the same every time when the ink-jet head 12 drops organic light emitting ink could be achieved accordingly. For example, as shown in FIG. 1, during the ink-jet head 12 moves along the moving direction M, the ink-jet head 12 utilizes the same number of the nozzles 13 to drops organic light emitting ink between two dotted lines $l_1$ and $l_2$ perpendicular to the border 15, so as to cause the ink volume jetted by each nozzle 13 to be the same with each other.

Finally, in Step 204, the ink-jet head 12 utilizes the same number of the nozzles 13 to drop organic light emitting ink into the bank 20 when the ink-jet head 12 is aligned with the bank 20. Accordingly, as shown in FIG. 1, the ink-jet head 12 could form the corresponding organic light emitting pixel 18 in the bank 20. As for description for the forming process of other organic light emitting pixel 18, it could be reasoned by analogy. In such a manner, each organic light emitting pixel 18 could be formed sequentially on the substrate 14 on the condition that the ink volume jetted by each nozzle 13 is the same with each other. Accordingly, the aforesaid prior art problem could be solved to make each organic light emitting pixel 18 have a preferable forming quality, so that the image display quality of the organic light emitting display panel 10 could be greatly improved.

To be noted, the aforesaid arrangement and shape designs for the organic light emitting pixels 18, the number of the banks 20 formed on the substrate 14, the number of the nozzles 13 utilized by the ink-jet head 12, and the number of the organic light emitting pixels 18 are not limited to the FIG. 1, meaning that all of them are adjustable according to the practical application of the organic light emitting display panel 10. In other words, all designs in which the ink-jet head and each bank array have the same oblique angle relative to the border of the substrate for forming the organic light emitting pixels may fall within the scope of the present invention.

Compared with the prior art, the present invention utilizes the design in which the arrangement direction of the banks forms the oblique angle with the border of the substrate and each ink-jet head is parallel to the organic light emitting pixels, to achieve the purpose that each ink-jet head utilizes the same number of the nozzles every time when dropping organic light emitting ink, so that the ink volume jetted by each nozzle could be the same with each other. In such a manner, via the aforesaid designs, the present invention could make each organic light emitting pixel have a preferable forming quality, so as to greatly improve the image display quality of the organic light emitting display panel.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for manufacturing an organic light emitting display panel, the organic light emitting display panel comprising a substrate, the method comprising:

forming a plurality of bank arrays on the substrate, each bank array having a plurality of banks for containing organic light emitting ink, an oblique angle being formed between an arrangement direction of the plurality of banks and a border of the substrate;

utilizing a plurality of ink-jet heads to move relative to the substrate along a moving direction perpendicular to the border of the substrate, each ink-jet head forming the oblique angle cooperatively with the border of the substrate and having a plurality of nozzles arranged alternately; and utilizing at least one of the plurality of nozzles to drop organic light emitting ink for forming at least one organic light emitting pixel in at least one bank;

wherein the oblique angle substantially conforms to the following equation:

$$\text{the oblique angle} = \cos^{-1}[(\text{a distance between two adjacent bank arrays})/(\text{a distance between two adjacent nozzles on each ink-jet head})].$$

2. The method of claim 1, wherein the step of utilizing at least one of the plurality of nozzles to drop organic light emitting ink for forming at least one organic light emitting pixel in at least one bank comprises:

utilizing the plurality of ink-jet heads to drop organic light emitting ink for forming a plurality of organic light emitting pixels on the substrate in a mosaic arrangement or a stripe arrangement.

3. The method of claim 1, wherein a longitudinal direction of each bank forms the oblique angle cooperatively with the border of the substrate.

* * * * *